US012760137B2

(12) United States Patent
Nishimura et al.

(10) Patent No.: US 12,760,137 B2
(45) Date of Patent: Oct. 13, 2026

(54) PHOTOSENSITIVE RESIN COMPOSITION, CURED PRODUCT THEREOF AND MULTILAYER MATERIAL

(71) Applicant: NIPPON KAYAKU KABUSHIKI KAISHA, Tokyo (JP)

(72) Inventors: Kengo Nishimura, Tokyo (JP); Takahumi Mizuguchi, Tokyo (JP); Kazuyoshi Yamamoto, Tokyo (JP); Mai Tsubamoto, Tokyo (JP)

(73) Assignee: NIPPON KAYAKU KABUSHIKI KAISHA, Tokyo (JP)

( * ) Notice: Subject to any disclaimer, the term of this patent is extended or adjusted under 35 U.S.C. 154(b) by 690 days.

(21) Appl. No.: 18/031,350

(22) PCT Filed: Nov. 4, 2021

(86) PCT No.: PCT/JP2021/040616
§ 371 (c)(1),
(2) Date: Apr. 12, 2023

(87) PCT Pub. No.: WO2022/097684
PCT Pub. Date: May 12, 2022

(65) Prior Publication Data
US 2023/0374186 A1 Nov. 23, 2023

(30) Foreign Application Priority Data
Nov. 6, 2020 (JP) ................................ 2020-185695

(51) Int. Cl.
*C08F 283/10* (2006.01)
*C08G 73/12* (2006.01)
*G03F 7/038* (2006.01)

(52) U.S. Cl.
CPC ............ *C08F 283/10* (2013.01); *C08G 73/12* (2013.01); *G03F 7/0387* (2013.01)

(58) Field of Classification Search
None
See application file for complete search history.

(56) References Cited

U.S. PATENT DOCUMENTS

2004/0225026 A1 11/2004 Mizori et al.
2009/0121255 A1 5/2009 Katayama
2011/0049731 A1 3/2011 Dershem et al.
2023/0374186 A1 11/2023 Nishimura et al.
2024/0182644 A1* 6/2024 Mizuguchi ............ C08L 79/085

FOREIGN PATENT DOCUMENTS

| | | |
|---|---|---|
| CN | 1967383 | 5/2007 |
| CN | 105778726 | 7/2016 |
| CN | 108495878 | 9/2018 |
| JP | H06324490 | 11/1994 |
| JP | 2006022173 | 1/2006 |
| JP | 2009102501 | 5/2009 |
| JP | 2010160419 | 7/2010 |
| JP | 2013083958 | 5/2013 |
| JP | 2019173009 | 10/2019 |
| JP | 2020132881 | 8/2020 |
| JP | 2020172667 | 10/2020 |
| KR | 1020160023555 | 3/2016 |
| TW | 200702351 | 1/2007 |
| TW | 202022010 | 6/2020 |
| WO | 2020059500 | 3/2020 |

OTHER PUBLICATIONS

"International Preliminary Report on Patentability (Form PCT/IB/373) of PCT/JP2021/040616," completed on May 8, 2023, with English translation thereof, pp. 1-8.
"Office Action of Related U.S. Appl. No. 17/600,381", issued on Dec. 15, 2023, pp. 1-21.
"International Search Report (Form PCT/ISA/210) of PCT/JP2021/040616", mailed on Jan. 11, 2022, with English translation thereof, pp. 1-5.
"Office Action of Taiwan Counterpart Application", issued on Feb. 13, 2025, with English translation thereof, pp. 1-8.
"Request for the Submission of an Opinion of Korea Counterpart Application", issued on Mar. 19, 2026, with English translation thereof, p. 1-p. 9.
"Office Action of China Counterpart Application", issued on Jun. 12, 2026, with English translation thereof, pp. 1-13.

* cited by examiner

*Primary Examiner* — Sanza L. McClendon
(74) *Attorney, Agent, or Firm* — JCIPRNET

(57) ABSTRACT

A resin composition contains a maleimide compound (I) that is the product of a reaction between a diamine (a-1) derived from a dimer acid and maleic anhydride, and a reactive polycarboxylic acid resin (II) that is the product of a reaction between a reactive epoxycarboxylate resin, the reactive epoxycarboxylate resin being the product of a reaction between an epoxy resin (b-1) and a compound (b-2) having a polymerizable ethylenically unsaturated group and a carboxy group together in one molecule, and a polybasic acid anhydride (b-3).

8 Claims, No Drawings

PHOTOSENSITIVE RESIN COMPOSITION, CURED PRODUCT THEREOF AND MULTILAYER MATERIAL

CROSS-REFERENCE TO RELATED APPLICATION

This application is a 371 application of the International PCT application serial no. PCT/JP2021/040616, filed on Nov. 4, 2021, which claims the priority benefit of Japan Patent Application No. 2020-185695, filed on Nov. 6, 2020. The entirety of each of the above-mentioned patent applications is hereby incorporated by reference herein and made a part of this specification.

TECHNICAL FIELD

The present invention relates to a photosensitive resin composition, a cured product thereof and a use thereof. More specifically, the present invention relates to a photosensitive resin composition which exhibits excellent developability and of which a cured product exhibits excellent dielectric properties and flexibility and high insulation reliability, and also relates to a use of the photosensitive resin composition.

RELATED ART

Photosensitive resin compositions are applied to various resist materials or printed wiring boards because they can be microfabricated according to the principle of photolithography. In recent years, as information communication apparatuses have been reduced in size and increased in density and communication speed, in view of low dielectric properties and the properties related to long-term reliability, such as substrate adhesion, low water absorption and moisture resistance, as well as in view of environmental protection, there has been a demand for a negative photosensitive material that can be developed with a weakly alkaline aqueous solution.

As an example satisfying the above properties to some extent, a carboxylate resin is well known which may be obtained by reacting a general epoxy resin together with (meth)acrylic acid and a carboxylic acid compound having a hydroxyl group, and it is further well known that this resin has resist ink suitability (Patent Document 1). However, in the carboxylate resin, since an ester group having high polarity (dipole moment) or a secondary hydroxyl group that remains due to the absence of reaction with the carboxylic acid compound adversely affect the dielectric properties, low water absorption and moisture resistance, it has been required that both of the above physical properties be at a relatively high level.

As another photosensitive resin, there has been discussed a bismaleimide compound described in Patent Document 2, which is obtained by reacting a dimer acid-derived diamine with a tetracarboxylic dianhydride having an alicyclic skeleton, and maleic anhydride. The bismaleimide compound is characterized by having excellent dielectric properties, low water absorption and moisture resistance due to a dimer acid-derived long-chain alkyl group, as well as having high substrate adhesion due to improved flexibility. However, although a maleimide compound including a dimer acid-derived diamine and maleic anhydride makes it possible to obtain a cured film having high insulation reliability and flexibility because of the dimer acid-derived long-chain alkyl group, due to high hydrophobicity caused by the dimer acid-derived long-chain alkyl group, development with an alkaline aqueous solution has been difficult.

PRIOR-ART DOCUMENTS

Patent Documents

Patent Document 1: International Publication No. WO2020/059500

Patent Document 2: Japanese Patent Laid-open No. 2013-83958

SUMMARY OF THE INVENTION

Problems to be Solved by the Invention

Accordingly, an object of the present invention is to provide a composition containing a maleimide compound that includes a dimer acid-derived diamine and maleic anhydride, and to provide a cured product containing the composition, in which the composition reduces the above conventional problems and has good developability, high insulation reliability and flexibility.

Means for Solving the Problems

As a result of intensive studies conducted to achieve the above object, the present inventors have found that a resin composition containing both a maleimide compound (I) and a reactive polycarboxylic acid resin (II) can be developed with a weakly alkaline aqueous solution, and that a cured film of the resin composition has high insulation reliability and flexibility. The maleimide compound (I) includes a dimer acid-derived diamine (a-1) and maleic anhydride. The reactive polycarboxylic acid resin (II) is a product of reaction between a reactive epoxycarboxylate resin and a polybasic acid anhydride (b-3), in which the reactive epoxycarboxylate resin is a product of reaction between an epoxy resin (b-1) and a compound (b-2) having a polymerizable ethylenically unsaturated group and a carboxy group together in one molecule.

That is, the present invention relates to the following (1) to (8).

(1) a resin composition, containing: a maleimide compound (I), being a product of reaction between a dimer acid-derived diamine (a-1) and maleic anhydride; and a reactive polycarboxylic acid resin (II), being a product of reaction between a reactive epoxycarboxylate resin and a polybasic acid anhydride (b-3), in which the reactive epoxycarboxylate resin is a product of reaction between an epoxy resin (b-1) and a compound (b-2) having a polymerizable ethylenically unsaturated group and a carboxy group together in one molecule.

(2) The resin composition described in (1), in which the maleimide compound (I) includes the dimer acid-derived diamine (a-1), a polybasic acid anhydride (a-2), and the maleic anhydride.

(3) The resin composition described in (2), in which the polybasic acid anhydride (a-2) has an alicyclic structure.

(4) The resin composition described in any one of (1) to (3), in which the maleimide compound (I) is expressed by the following general formula (1):

(1)

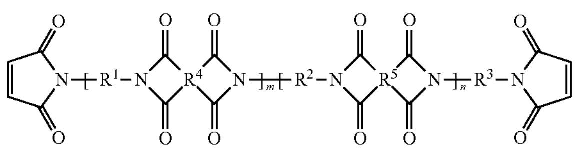

[In the formula (1), $R^1$ represents a dimer acid-derived divalent hydrocarbon group (a), $R^2$ represents a divalent organic group (b) other than the dimer acid-derived divalent hydrocarbon group (a), $R^3$ represents any one selected from a group consisting of the dimer acid-derived divalent hydrocarbon group (a) and the divalent organic group (b) other than the dimer acid-derived divalent hydrocarbon group (a), $R^4$ and $R^5$ each independently contain, with respect to a total amount of $R^4$ and $R^5$ of 100 mol %, 5 mol % to 95 mol % of one or more organic groups selected from a C6 to C40 tetravalent organic group having a monocyclic or condensed polycyclic alicyclic structure, a C4 to C40 tetravalent organic group in which organic groups having a monocyclic alicyclic structure are connected to each other directly or via a crosslinked structure, and a C4 to C40 tetravalent organic group having a semi-alicyclic structure including both an alicyclic structure and an aromatic ring. m is an integer of 1 to 30, and n is an integer of 0 to 30. If m is 2 or more, a plurality of $R^1$ and a plurality of $R^4$ may each be the same or different; if n is 2 or more, a plurality of $R^2$ and a plurality of $R^5$ may each be the same or different.]

(5) The resin composition described in any one of (1) to (4), in which the epoxy resin (b-1) is expressed by the following general formula (2):

(2)

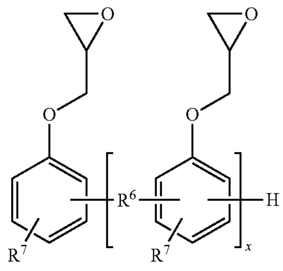

[In the formula (2), $R^6$ represents a hydrocarbon group containing an aromatic ring or a C1 to C40 alicyclic skeleton, $R^7$ may each be the same or different and represents a hydrogen atom, a halogen atom or a C1 to C40 hydrocarbon group. x is an integer of 1 to 30.]

(6) The resin composition described in any one of (1) to (5), containing a photopolymerization initiator.

(7) A cured product of the resin composition described in any one of (1) to (6).

(8) An article using the cured product described in (7).

Effects of the Invention

The resin composition of the present invention as described below not only makes it possible to obtain a cured product having high insulation reliability and flexibility, but also has good developability. The resin composition contains: the maleimide compound (I) being the product of reaction between the dimer acid-derived diamine (a-1) and maleic anhydride; and the reactive polycarboxylic acid resin (II) being the product of reaction between the reactive epoxycarboxylate resin and the polybasic acid anhydride (b-3), in which the reactive epoxycarboxylate resin is the product of reaction between the epoxy resin (b-1) and the compound (b-2) having a polymerizable ethylenically unsaturated group and a carboxy group together in one molecule. Hence, the present invention can be suitably used in a film forming material that requires development using a weak alkali and has high insulation reliability.

The present invention can suitably be used in applications such as, for example, solder resist for printed wiring boards, a protective film for multilayer printed wiring boards, an interlayer insulating material for multilayer printed wiring boards, solder resist for flexible printed wiring boards, plating resist, and a photosensitive optical waveguide, in which particularly high insulation reliability is required.

DESCRIPTION OF THE EMBODIMENTS

An embodiment may be obtained by containing: a maleimide compound (I), being a product of reaction between a dimer acid-derived diamine (a-1) and maleic anhydride; and a reactive polycarboxylic acid resin (II), being a product of reaction between a reactive epoxycarboxylate resin and a polybasic acid anhydride (b-3), in which the reactive epoxycarboxylate resin is a product of reaction between an epoxy resin (b-1) and a compound (b-2) having a polymerizable ethylenically unsaturated group and a carboxy group together in one molecule, and may exhibit the characteristics of the present invention.

Hereinafter, the present invention will be described in detail based on a preferred embodiment thereof.

<Maleimide Compound (I)>

The maleimide compound (I) according to the present invention has a dimer acid-derived divalent hydrocarbon group (a) and a cyclic imide bond. The maleimide compound (I) like this can be obtained by reacting a dimer acid-derived diamine (a-1) with maleic anhydride.

The dimer acid-derived divalent hydrocarbon group (a) refers to a divalent residue obtained by removing two carboxyl groups from a dicarboxylic acid contained in a dimer acid. In the present invention, the dimer acid-derived divalent hydrocarbon group (a) like this can be introduced into a maleimide compound by reacting the dimer acid-derived diamine (a-1) with a polybasic acid anhydride (a-2) and maleic anhydride to be described later and forming an imide bond.

In the present invention, the dimer acid is obtained by dimerizing an unsaturated bond of an unsaturated carboxylic acid such as linoleic acid, oleic acid, and linolenic acid, followed by purification by distillation. The dimer acid mainly contains a dicarboxylic acid having 36 carbons, and generally contains up to about 5% by mass of a tricarboxylic acid having 54 carbons and up to about 5% by mass of a monocarboxylic acid. The dimer acid-derived diamine (a-1) according to the present invention is a diamine obtained by substituting an amino group for two carboxyl groups of each dicarboxylic acid contained in the dimer acid, and is generally a mixture. In the present invention, examples of the dimer acid-derived diamine (a-1) like this include a diamine such as [3,4-bis(1-aminoheptyl)6-hexyl-5-(1-octenyl)]cyclohexane, or those containing a diamine in which an unsaturated bond is saturated by further subjecting the above diamine to hydrogenation.

The dimer acid-derived divalent hydrocarbon group (a) according to the present invention, which is introduced into the maleimide compound by using the dimer acid-derived diamine (a-1) like this, is preferably a residue obtained by removing two amino groups from the dimer acid-derived diamine (a-1). When obtaining the maleimide compound according to the present invention by using the dimer acid-derived diamine (a-1), one kind of the dimer acid-derived diamine (a-1) may be used alone, or two or more kinds thereof having different compositions may be used in combination. Furthermore, as the dimer acid-derived diamine (a-1) like this, for example, a commercially available product such as "PRIAMINE 1074" (manufactured by Croda Japan), may be used.

In the present invention, the cyclic imide bond refers to a bond in which two imide bonds are cyclically linked. In the present invention, such a cyclic imide bond can be introduced into the maleimide compound by reacting the polybasic acid anhydride (a-2) with the dimer acid-derived diamine (a-1) described above and a divalent organic group (b) other than the dimer acid-derived divalent hydrocarbon group (a) that will be described later and forming an imide bond.

In the present invention, the maleimide compound (I) preferably has the following general formula (1). In the general formula (1), $R^4$ and $R^5$ are structures derived from the polybasic acid anhydride (a-2).

(1)

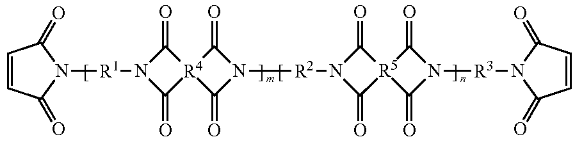

In the formula (1), $R^1$ represents a dimer acid-derived divalent hydrocarbon group (a), $R^2$ represents the divalent organic group (b) other than the dimer acid-derived divalent hydrocarbon group (a), $R^3$ represents any one selected from a group consisting of the dimer acid-derived divalent hydrocarbon group (a) and the divalent organic group (b) other than the dimer acid-derived divalent hydrocarbon group (a), $R^4$ and $R^5$ each independently contain, with respect to a total amount of $R^4$ and $R^5$ of 100 mol %, 5 mol % to 95 mol % of one or more organic groups selected from a C6 to C40 tetravalent organic group having a monocyclic or condensed polycyclic alicyclic structure, a C4 to C40 tetravalent organic group in which organic groups having a monocyclic alicyclic structure are connected to each other directly or via a crosslinked structure, and a C4 to C40 tetravalent organic group having a semi-alicyclic structure including both an alicyclic structure and an aromatic ring. m is an integer of 1 to 30, and n is an integer of 0 to 30. If m is 2 or more, a plurality of $R^1$ and a plurality of $R^4$ may each be the same or different; if n is 2 or more, a plurality of $R^2$ and a plurality of $R^5$ may each be the same or different.

In the present invention, the polybasic acid anhydride (a-2) is preferably a polybasic acid anhydride (a-2) expressed by the following general formula (3). The polybasic acid anhydride (a-2) expressed by the following general formula (3) has an alicyclic structure adjacent to an anhydride group.

(3)

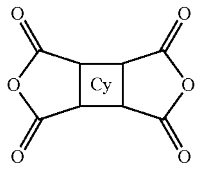

(In the formula, Cy is a C4 to C40 tetravalent hydrocarbon ring group, and the hydrocarbon ring group may contain an aromatic ring.)

In the present invention, the polybasic acid anhydride (a-2) preferably contains a structure expressed by the following general formulas (3-1) to (3-16). The polybasic acid anhydride (a-2) expressed by the formulas (3-1) to (3-16) has a structure containing: a C4 to C40 tetravalent organic group having a monocyclic or condensed polycyclic alicyclic structure, a C4 to C40 tetravalent organic group in which organic groups having a monocyclic alicyclic structure are connected to each other directly or via a crosslinked structure, and a C4 to C40 tetravalent organic group having a semi-alicyclic structure including both an alicyclic structure and an aromatic ring.

(3-1)

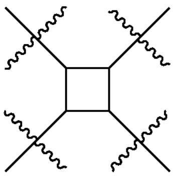

(3-2)

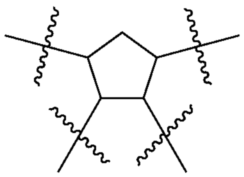

(3-3)

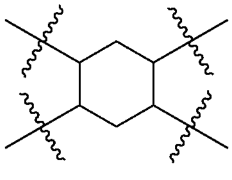

(3-4)

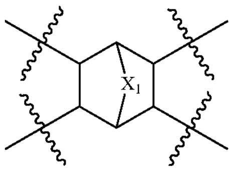

(3-5)

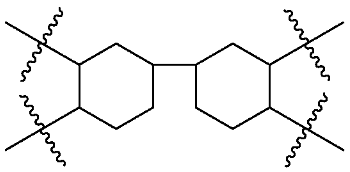

-continued (3-6)

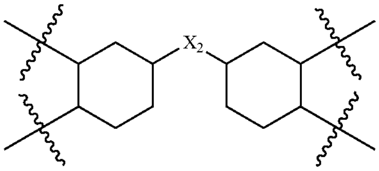

(3-7)

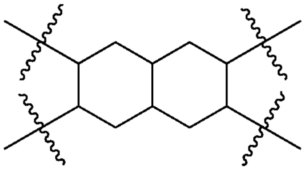

(3-8)

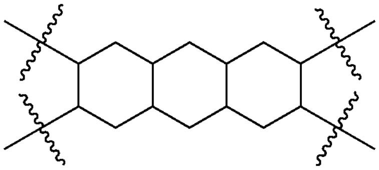

(3-9)

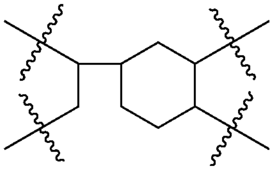

(3-10)

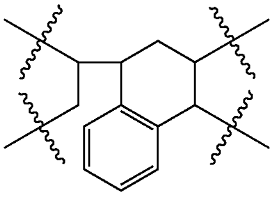

(3-11)

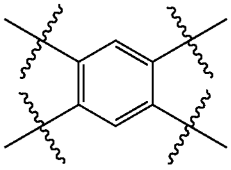

(3-12)

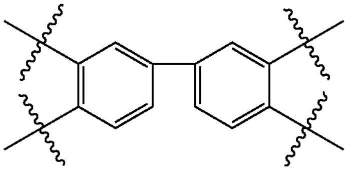

(3-13)

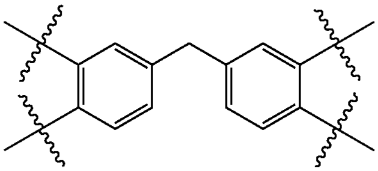

-continued (3-14)

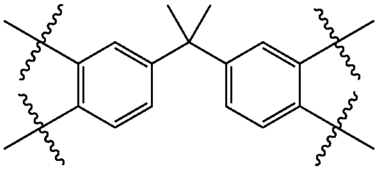

(3-15)

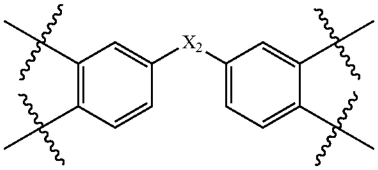

(3-16)

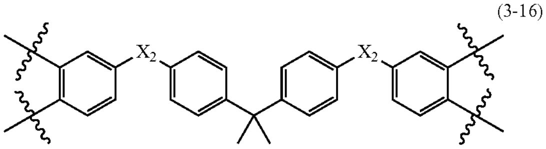

(In the general formula (3-4), $X_1$ is an oxygen atom, a sulfur atom, a sulfonyl group or a C1 to C3 divalent organic group, or a divalent crosslinked structure formed by linking two or more thereof. In the general formulas (3-6), (3-15) and (3-16), $X_2$ is a direct bond, an oxygen atom, a sulfur atom, or a divalent crosslinked structure formed by linking two or more organic groups selected from a sulfonyl group, a carbonyl group, a C1 to C3 divalent organic group or an arylene group.)

Specific examples of the polybasic acid anhydride (a-2) used in the present invention, which contains a C4 to C40 tetravalent organic group having a monocyclic or condensed polycyclic alicyclic structure, a C4 to C40 tetravalent organic group in which organic groups having a monocyclic alicyclic structure are connected to each other directly or via a crosslinked structure, and a C4 to C40 tetravalent organic group having a semi-alicyclic structure including both an alicyclic structure and an aromatic ring, include: alicyclic tetracarboxylic dianhydride, such as 1,2,3,4-cyclobutanetetracarboxylic dianhydride (CBDA), 1,2-dimethyl-1,2,3,4-cyclobutanetetracarboxylic dianhydride, 1,2,3,4-tetramethyl-1,2,3,4-cyclobutanetetracarboxylic dianhydride, 1,2,3,4-cyclopentanetetracarboxylic dianhydride, 1,2,4,5-cyclohexanetetracarboxylic dianhydride (H-PMDA), 1,2,4,5-bicyclohexanetetracarboxylic dianhydride (H-BPDA), 4-(2,5-dioxotetrahydrofuran-3-yl)-1,2,3,4-tetrahydronaphthalene-1,2-dicarboxylic anhydride, 5-(2,5-dioxotetrahydrofuryl)-3-methyl-3-cyclohexene-1,2-dicarboxylic dianhydride, bicyclo[2.2.2]oct-7-ene-2,3,5,6-tetracarboxylic dianhydride, 2,3,4,5-tetrahydrofurantetracarboxylic dianhydride, and 3,5,6-tricarboxy-2-norbornane acetic acid dianhydride or a compound in which an aromatic ring of the foregoing is replaced with an alkyl group or a halogen atom; and semi-alicyclic tetracarboxylic dianhydride, such as 1,3,3a,4,5,9b-hexahydro-5(tetrahydro-2,5-dioxo-3-furanyl) naphtho[1,2-c]furan-1,3-dione or a compound in which a hydrogen atom of an aromatic ring of the foregoing is replaced with an alkyl group or a halogen atom. Other examples include: aromatic tetracarboxylic dianhydride, such as pyromellitic dianhydride, 4,4'-oxydiphthalic dianhydride, 3,3',4,4'-biphenyltetracarboxylic dianhydride, 2,3,3',4'-biphenyltetracarboxylic dianhydride, 2,2',3,3'-biphenyltetracarboxylic dianhydride, 3,3',4,4'-benzophenonetetracarboxylic dianhydride, 2,2',3,3'- benzophenonetetracarboxylic dianhydride, 2,2-bis(3,4-dicarboxyphenyl)propane dianhydride, 2,2-bis(2,3-dicarboxyphenyl)propane dianhydride, 1,1-bis(3,4-dicarboxyphenyl)ethane dianhydride, 1,1-bis(2,3-dicarboxyphenyl)ethane dianhydride, bis(3,4-dicarboxyphenyl)methane dianhydride, bis(2,3-dicarboxyphenyl)methane dianhydride, 1,2,5,6-naphthalenetetracarboxylic dianhydride, 2,3,6,7-naphthalenetetracarboxylic dianhydride, 2,3,5,6-pyridinetetracarboxylic dianhydride, and 3,4,9,10-perylenetetracarboxylic dianhydride; bis(3,4-dicarboxyphenyl)sulfone dianhydride, bis(3,4-dicarboxy phenyl)ether dianhydride, 2,2-bis(3,4-dicarboxyphenyl) hexafluoropropane dianhydride or a compound in which an aromatic ring of these compounds is replaced with an alkyl group or a halogen atom; and aromatic acid dianhydride, such as an acid dianhydride having an amide group. These can be used in combination of two or more with an acid dianhydride containing a C4 to C40 alicyclic structure or a semi-alicyclic structure.

Furthermore, from the viewpoint of high exposure sensitivity, high resolution, and insulation reliability of a cured film, those containing no aromatic ring are preferable. A reason is that those containing an aromatic ring tend to have low photosensitivity due to deterioration in hue. Among the polybasic acid anhydrides containing no aromatic ring, a case of using 1,2,4,5-cyclohexanetetracarboxylic dianhydride (H-PMDA) exhibits high photocurability and is preferable.

Furthermore, the maleimide compound (I) according to the present invention may be a maleimide compound obtained by reacting the dimer acid-derived diamine (a-1), the divalent organic group (b) other than the dimer acid-derived divalent hydrocarbon group (a), the tetracarboxylic dianhydride and the maleic anhydride. By copolymerizing the divalent organic group (b) other than the dimer acid-derived divalent hydrocarbon group (a), it is possible to control the required physical properties according to need, such as to further reduce tensile elastic modulus of a resulting cured product.

The divalent organic group (b) (hereinafter sometimes simply referred to as organic diamine (b)) other than the dimer acid-derived divalent hydrocarbon group (a) refers to a diamine other than that contained in the dimer acid-derived diamine (a-1) in the present invention. The divalent organic group (b) other than the dimer acid-derived divalent hydrocarbon group (a) like this is not particularly limited, and examples thereof include: an aliphatic diamine, such as 1,6-hexamethylenediamine; an alicyclic diamine, such as 1,4-diaminocyclohexane and 1,3-bis(aminomethyl)cyclohexane; an aromatic diamine, such as 4,4'-diaminodiphenyl ether, 3,4'-diaminodiphenyl ether, 1,4-bis(4-aminophenoxy) benzene, 1,3-bis(aminomethyl)benzene, 1,3-bis(4-aminophenoxy)benzene, 1,3-bis(3-aminophenoxy)benzene, 1,4-diaminobenzene, 1,3-diaminobenzene, 2,4-diaminotoluene, and 4,4'-diaminodiphenylmethane; 4,4'-diaminodiphenylsulfone; 3,3'-diaminodiphenylsulfone; 4,4-diaminobenzophenone; 4,4-diaminodiphenylsulfide; and 2,2-bis[4-(4-aminophenoxy)phenyl]propane. Among them, from the viewpoint of obtaining a cured product with relatively low tensile elastic modulus, relatively preferable are: an aliphatic diamine having 6 to 12 carbons, such as 1,6-hexamethylenediamine; diaminocyclohexane, such as 1,4-diaminocyclohexane; and an aromatic diamine having an aliphatic structure with 1 to 4 carbons in an aromatic skeleton, such as 2,2-bis[4-(4-aminophenoxy)phenyl]propane. When obtaining the maleimide compound (I) according to the present invention by using these examples of the divalent organic group (b) other than the dimer acid-derived divalent hydrocarbon group (a), one of these examples of the divalent organic group (b) other than the dimer acid-derived divalent hydrocarbon group (a) may be used alone, or two or more thereof may be used in combination.

The dimer acid-derived divalent hydrocarbon group (a) in the formula (1) is as described above. In the present invention, the divalent organic group (b) other than the dimer acid-derived divalent hydrocarbon group (a) in the formula (1) refers to a divalent residue obtained by removing two amino groups from the divalent organic group (b) other than the dimer acid-derived divalent hydrocarbon group (a). However, in the same compound, the dimer acid-derived divalent hydrocarbon group (a) is not the same as the divalent organic group (b) other than the dimer acid-derived divalent hydrocarbon group (a). Furthermore, the tetravalent organic group in the formula (1) refers to a tetravalent residue obtained by removing two groups expressed by —CO—O—CO— from the tetracarboxylic dianhydride.

In the formula (1), m is the number of repeating units (hereinafter sometimes referred to as dimer acid-derived structures) containing the dimer acid-derived divalent hydrocarbon group (a), and represents an integer of 1 to 30. If a value of m exceeds the above upper limit, solubility in a solvent is reduced. In particular, the solubility in a developer during development to be described later is reduced. The value of m is particularly preferably 3 to 10 from the viewpoint of suitable solubility in the developer during development.

In the formula (1), n is the number of repeating units (hereinafter sometimes referred to as organic diamine-derived structures) containing the divalent organic group (b) other than the dimer acid-derived divalent hydrocarbon group (a), and represents an integer of 0 to 30. If a value of n exceeds the above upper limit, flexibility of the resulting cured product deteriorates, and a hard and brittle resin is obtained. The value of n is particularly preferably 0 to 10 from the viewpoint that a cured product with low elastic modulus tends to be able to be obtained.

Furthermore, if m in the formula (1) is 2 or more, $R^1$ and $R^4$ may each be the same or different; if n in the formula (1) is 2 or more, $R^2$ and $R^5$ may each be the same or different. Furthermore, in the maleimide compound expressed by the formula (1), the dimer acid-derived structure and the organic diamine-derived structure may be random or block.

In the case of obtaining the maleimide compound (I) according to the present invention from the dimer acid-derived diamine (a-1), the maleic anhydride, the polybasic acid anhydride (a-2), and the organic diamine (b) as necessary, when a reaction rate is 100%, n and m mentioned above can be expressed by a mixing molar ratio of all diamines contained in the dimer acid-derived diamine (a-1), the organic diamine (b), the maleic anhydride and the polybasic acid anhydride (a-2). That is, (m+n):(m+n+2) is expressed by (total number of moles of all diamines contained in the dimer acid-derived diamine (a-1) and the divalent organic group (b) other than the dimer acid-derived divalent hydrocarbon group (a)):(total number of moles of maleic anhydride and the polybasic acid anhydride (a-2)). m:n is expressed by (number of moles of all diamines contained in the dimer acid-derived diamine (a-1)):(number of moles of the divalent organic group (b) other than the dimer acid-derived divalent hydrocarbon group (a)). 2:(m+n) is expressed by (number of moles of maleic anhydride):(number of moles of the polybasic acid anhydride (a-2)).

The maleimide compound (I) in the present invention also includes one obtained by directly maleimidating a dimer acid-derived diamine without using the polybasic acid anhydride (a-2).

As the maleimide compound (I) according to the present invention, a commercially available compound may be used as appropriate. For example, "BMI-689", "BMI-1400", "BMI-1500", "BMI-1700", "BMI-2500", "BMI-2560" and "BMI-3000" (manufactured by Designer Molecules Inc.) can be suitably used. As the maleimide compound (I) according to the present invention, one kind may be used alone, or two or more kinds may be used in combination.

The content of the maleimide compound (I) in the present invention is preferably 10% by mass to 95% by mass with respect to all components. As the content of the maleimide compound (I) increases, while insulation reliability and flexibility tend to increase, alkali developability is adversely affected. Hence, a more preferable range is 30% by mass to 70% by mass.

<Reactive Polycarboxylic Acid Resin (II)>

The reactive polycarboxylic acid resin (II) in the present invention can be obtained by reacting the reactive epoxycarboxylate resin with the polybasic acid anhydride (b-3), the reactive epoxycarboxylate resin being a product of reaction between the epoxy resin (b-1) and the compound (b-2) having a polymerizable ethylenically unsaturated group and a carboxy group together in one molecule.

In the present invention, the epoxy resin (b-1) is expressed by the following general formula (2):

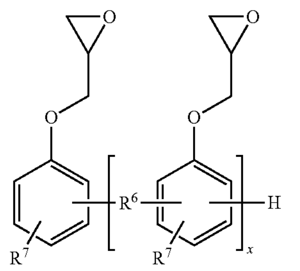

(2)

[In the formula (2), $R^6$ represents a hydrocarbon group containing an aromatic ring or a C1 to C40 alicyclic skeleton, $R^7$ may each be the same or different and represents a hydrogen atom, a halogen atom or a C1 to C40 hydrocarbon group. x is an integer of 1 to 30.]

Examples thereof include novolac type epoxy resin, bisphenol A type epoxy resin, bisphenol F type epoxy resin, biphenyl type epoxy resin, dicyclopentadiene type epoxy resin, an epoxy compound containing a naphthyl skeleton, and an epoxy compound containing a fluorenyl skeleton.

Commercially available examples of the novolac type epoxy resin include YDCN-701, YDCN-702, YDCN-703, YDCN-704, YDCN-704L, YDPN-638, YDPN-602 (all trade names, manufactured by Nippon Steel & Sumikin Chemical), DEN-431, DEN-439 (both trade names, manufactured by Dow Chemical), EOCN-120, EOCN-102S, EOCN-103S, EOCN-104S, EOCN-1012, EOCN-1025, EOCN-1027, BREN (all trade names, manufactured by Nippon Kayaku), EPN-1138, EPN-1235, EPN-1299 (all trade names, manufactured by BASF Japan), N-730, N-770, N-865, N-665, N-673, VH-4150, and VH-4240 (all trade names, manufactured by DIC). Commercially available examples of the bisphenol A type epoxy resin or the bisphenol F type epoxy resin include Epikote 807, Epikote 815, Epikote 825, Epikote 827, Epikote 828, Epikote 834, Epikote 1001, Epikote 1004, Epikote 1007 and Epikote 1009 (all trade names, manufactured by Mitsubishi Chemical), DER-330, DER-301, DER-361 (all trade names, manufactured by Dow Chemical), YD-8125, YDF-170, YDF-175S, YDF-2001, YDF-2004, and YDF-8170 (all trade names, manufactured by Nippon Steel & Sumikin Chemical). Commercially available examples of the biphenyl type epoxy resin include NC3000, NC3000H, NC3000L, NC3100 (all manufactured by Nippon Kayaku), GK3207 (manufactured by Tohto Kasei), YX4000HK (manufactured by Japan Epoxy Resin), and BPAE (manufactured by Nippon Steel Chemical). Commercially available examples of the dicyclopentadiene type epoxy resin include HP7200, HP7200H, HP7200HH (all manufactured by DIC), XD-1000, XD-1000-L, and XD-10002L (all manufactured by Nippon Kayaku). Commercially available examples of the epoxy compound containing a naphthyl skeleton include HP4032, HP4700, HP4770, HP5000, HP6000 (manufactured by DIC), NC-7000, NC-7300 (manufactured by Nippon Kayaku), ESN-175 (manufactured by Nippon Steel Chemical), and ESN-475V (manufactured by Tohto Kasei). Commercially available examples of the epoxy compound containing a fluorenyl skeleton include OGSOL PG-100 and OGSOL EG-200 (both manufactured by Osaka Gas Chemicals). In particular, the dicyclopentadiene type epoxy resin is more preferable because it has high compatibility with the maleimide compound (I) and further improves the alkali developability.

In the present invention, the compound (b-2) having a polymerizable ethylenically unsaturated group and a carboxy group together in one molecule is reacted in order to impart reactivity to an active energy ray. If one or more ethylenically unsaturated groups and one or more carboxyl groups are present in a molecule, no limitation is imposed thereon.

In the present invention, examples of the compound (b-2) having a polymerizable ethylenically unsaturated group and a carboxy group together in one molecule include (meth) acrylic acids or crotonic acid, a-cyanocinnamic acid, cinnamic acid, or a product of reaction between a saturated or unsaturated dibasic acid and an unsaturated group-containing monoglycidyl compound. In the above, examples of the (meth)acrylic acids include: (meth)acrylic acid, β-styrylacrylic acid, β-furfurylacrylic acid, (meth)acrylic acid dimer, half esters which are a product of an equimolar reaction between a saturated or unsaturated dibasic acid anhydride and a (meth)acrylate derivative having one hydroxyl group in one molecule, a monocarboxylic acid compound containing one carboxy group in one molecule, such as half esters which are a product of an equimolar reaction between a saturated or unsaturated dibasic acid and monoglycidyl (meth)acrylate derivatives, half esters which are a product of an equimolar reaction between a saturated or unsaturated dibasic acid anhydride and a (meth)acrylate derivative having a plurality of hydroxyl groups in one molecule, and a polycarboxylic acid compound having a plurality of carboxy groups in one molecule, such as half esters which are a product of an equimolar reaction between a saturated or unsaturated dibasic acid and glycidyl (meth) acrylate derivatives having a plurality of epoxy groups.

Among them, the epoxy resin (b-1) and the compound (b-2) having a polymerizable ethylenically unsaturated group and a carboxy group together in one molecule are preferably a monocarboxylic acid. If a monocarboxylic acid and a polycarboxylic acid are used in combination, a value expressed by molar amount of monocarboxylic acid/molar amount of polycarboxylic acid is preferably 15 or more.

In terms of sensitivity to an active energy ray when forming a resin composition, most preferable examples include (meth)acrylic acid, a product of reaction between (meth)acrylic acid and E-caprolactone, or cinnamic acid.

A compound having one or more polymerizable ethylenically unsaturated groups and one or more carboxy groups together in one molecule is preferably a compound having no hydroxyl group.

A compound (c-1) (hereinafter also simply referred to as "compound (c-1)") having a hydroxyl group and a carboxy group together in one molecule, which is used as necessary in the present invention, is reacted for the purpose of introducing the hydroxyl group into a carboxylate compound. These include a compound having one hydroxyl group and one carboxyl group together in one molecule, a compound having two or more hydroxyl groups and one carboxy group together in one molecule, and a compound having one or more hydroxyl groups and two or more carboxy groups together in one molecule.

Examples of the compound having one hydroxyl group and one carboxyl group together in one molecule include hydroxypropionic acid, hydroxybutanoic acid, and hydroxystearic acid. Examples of the compound having two or more hydroxyl groups and one carboxy group together in one molecule include dimethylolacetic acid, dimethylolpropionic acid, and dimethylolbutanoic acid. Examples of the compound having one or more hydroxyl groups and two or more carboxy groups together in one molecule include hydroxyphthalic acid.

Among them, those containing two or more hydroxyl groups in one molecule are preferable in view of the effects of the present invention. Furthermore, those containing one carboxyl group in one molecule are preferable in view of stability of carboxylation reaction. Those having two hydroxyl groups and one carboxy group in one molecule are most preferable. In view of availability of raw materials, dimethylolpropionic acid and dimethylolbutanoic acid are particularly suitable.

A compound having one or more hydroxyl groups and one or more carboxyl groups together in one molecule is preferably a compound having no polymerizable ethylenically unsaturated group.

A preparation ratio between the epoxy resin (b-1), the compound (b-2) having a polymerizable ethylenically unsaturated group and a carboxy group together in one molecule and the compound (c-1) used as necessary in the carboxylation reaction should be changed as appropriate depending on the use. That is, in the case where all the epoxy groups are carboxylated, since no unreacted epoxy group remains, storage stability as reactive epoxy carboxylate resin is high. In this case, only the reactivity due to an introduced double bond is utilized.

By reducing the preparation amount of the compound (b-2) having a polymerizable ethylenically unsaturated group and a carboxy group together in one molecule and the compound (c-1) and leaving unreacted residual epoxy groups, a combined use of the reactivity due to an introduced unsaturated bond and a reaction (for example, polymerization reaction or thermal polymerization reaction by a photocationic catalyst) by the residual epoxy groups is also possible. However, in this case, attention should be paid to storage of the reactive epoxy carboxylate resin and consideration of production conditions.

In the case of producing a reactive epoxy carboxylate resin in which epoxy groups are not allowed to remain, the total amount of the compound (b-2) having a polymerizable ethylenically unsaturated group and a carboxy group together in one molecule and the compound (c-1) used as necessary is preferably 90% to 120% by equivalent with respect to 1 equivalent of the epoxy resin (b-1). If within this range, production under relatively stable conditions is possible. If the preparation amount of the carboxylic acid compound is more than the above range, the excess compound (b-2) having a polymerizable ethylenically unsaturated group and a carboxy group together in one molecule and the excess compound (c-1) may remain, which is thus not preferable.

If epoxy groups are allowed to remain, the total amount of the compound (b-2) having a polymerizable ethylenically unsaturated group and a carboxy group together in one molecule and the compound (c-1) used as necessary is preferably 20% to 90% by equivalent with respect to 1 equivalent of the epoxy resin (b-1). If outside this range, the effect of composite curing is reduced. Of course, in this case, sufficient attention needs be paid to gelation during the reaction or the stability of the reactive epoxy carboxylate resin over time.

The carboxylation reaction can be carried out without a solvent or after dilution with a solvent. The solvent that can be used here is not particularly limited if it is an inert solvent for the carboxylation reaction.

The preferable amount of the solvent used should be adjusted as appropriate according to viscosity or use of the resulting resin. The solvent is preferably used so that the solid content is 90% to 30% by mass, more preferably 80% to 50% by mass.

Examples of the solvent for use in the carboxylation reaction include: an aromatic hydrocarbon solvent, such as toluene, xylene, ethylbenzene, and tetramethylbenzene; an aliphatic hydrocarbon solvent, such as hexane, octane, and decane; and a mixture thereof, such as petroleum ether, white gasoline, and solvent naphtha, an ester-based solvent, an ether-based solvent, and a ketone-based solvent.

Examples of the ester-based solvent include: alkyl acetates, such as ethyl acetate, propyl acetate, and butyl acetate; cyclic esters, such as y-butyrolactone; mono- or poly-alkylene glycol monoalkyl ether monoacetates, such as ethylene glycol monomethyl ether acetate, diethylene glycol monomethyl ether monoacetate, diethylene glycol monoethyl ether monoacetate, triethylene glycol monoethyl ether monoacetate, diethylene glycol monobutyl ether monoacetate, propylene glycol monomethyl ether monoacetate, and butylene glycol monomethyl ether acetate; and polycarboxylic acid alkyl esters, such as dialkyl glutarate, dialkyl succinate, and dialkyl adipate.

Examples of the ether-based solvent include: alkyl ethers, such as diethyl ether and ethyl butyl ether; glycol ethers, such as ethylene glycol dimethyl ether, ethylene glycol diethyl ether, dipropylene glycol dimethyl ether, dipropylene glycol diethyl ether, triethylene glycol dimethyl ether, and triethylene glycol diethyl ether; and cyclic ethers, such as tetrahydrofuran.

Examples of the ketone-based solvent include acetone, methyl ethyl ketone, cyclohexanone, and isophorone.

In addition, the reaction can be carried out in a single or mixed organic solvent such as a reactive compound (D) (hereinafter also simply referred to as "reactive compound (D)") described later. In this case, if the reactive compound (D) is used as a curable resin composition, it can be used directly as a composition, which is thus preferable.

During the carboxylation reaction, it is preferable to use a catalyst to promote the reaction. The amount of the catalyst used is 0.1 to 10 parts by mass with respect to 100 parts by mass of the total amount of a product of reaction, that is, a product of reaction in which the epoxy resin (b-1), the compound (b-2) having a polymerizable ethylenically unsaturated group and a carboxy group together in one molecule, the compound (c-1) used as necessary, and a solvent or the like depending on the situation are added. A reaction temperature at that time is 60° C. to 150° C., and a reaction time is preferably 5 to 60 hours. Specific examples of the catalyst that may be used include a known general basic catalyst such as triethylamine, benzyldimethylamine, triethylammonium chloride, benzyltrimethylammonium bromide, benzyltrimethylammonium iodide, triphenylphosphine, triphenylstibine, methyltriphenylstibine, chromium octanoate, and zirconium octanoate.

A thermal polymerization inhibitor can also be used. As the thermal polymerization inhibitor, hydroquinone monomethyl ether, 2-methylhydroquinone, hydroquinone, diphenylpicrylhydrazine, diphenylamine, 3,5-di-tert-butyl-4-hydroxytoluene or the like is preferably used.

During the carboxylation reaction, sampling is performed as appropriate, and a time point when an acid value of a sample reaches 5 mgKOH/g or less, preferably 3 mgKOH/g or less, is taken as an end point of the reaction.

Next, the reactive polycarboxylic acid resin (II) used in the present invention will be described. These reactive polycarboxylic acid resins may be obtained by reacting the reactive epoxy carboxylate resin with the polybasic acid anhydride (b-3). Reasons for introducing a carboxyl group by this acid addition process include, for example, to impart solubility in alkaline water, and to impart adhesion with respect to a metal, an inorganic substance or the like, to a portion not irradiated with an active energy ray in applications requiring resist patterning. In the acid addition process, a hydroxyl group of an epoxy carboxylate compound is reacted with the polybasic acid anhydride (b-3) to introduce the carboxyl group through an ester bond.

As the polybasic acid anhydride (b-3), for example, any compound having a cyclic acid anhydride structure in one molecule can be used. The polybasic acid anhydride (b-3) is preferably succinic anhydride, phthalic anhydride, tetrahydrophthalic anhydride, hexahydrophthalic anhydride, itaconic anhydride, 3-methyl-tetrahydrophthalic anhydride, 4-methyl-hexahydrophthalic anhydride, hydrogenated trimellitic anhydride, trimellitic anhydride or maleic anhydride, which are excellent in alkaline aqueous solution developability, heat resistance, hydrolysis resistance or the like.

A reaction for adding the polybasic anhydride (b-3) can be performed by adding the polybasic anhydride (b-3) to a solution of the epoxy carboxylate compound. The amount added may be changed as appropriate depending on the use.

The reactive polycarboxylic acid resin (II) obtained by reaction between the reactive epoxy carboxylate resin and the polybasic acid anhydride (b-3) is preferably prepared in a calculation amount so that a solid content acid value (in accordance with JISK5601-2-1:1999) is 20 to 120 mgKOH/g, more preferably 60 to 120 mgKOH/g.

When the solid content acid value is within this range, the resin composition of the present invention exhibits good alkaline aqueous solution developability. That is, good patterning properties and a wide range of control of overdevelopment are possible, and no excess acid anhydride remains.

During the reaction, it is preferable to use a catalyst to promote the reaction. The amount of the catalyst used is 0.1 to 10 parts by mass with respect to 100 parts by mass of the total amount of a product of reaction, that is, a product of reaction in which a reactive epoxy carboxylate compound obtained from the epoxy resin (b-1), the compound (b-2) having a polymerizable ethylenically unsaturated group and a carboxy group together in one molecule and the compound (c-1), and the polybasic acid anhydride (b-3), and a solvent or the like depending on the situation are added. Specific examples of the catalyst that may be used include triethylamine, benzyldimethylamine, triethylammonium chloride, benzyltrimethylammonium bromide, benzyltrimethylammonium iodide, triphenylphosphine, triphenylstibine, methyltriphenylstibine, chromium octanoate, and zirconium octanoate.

This acid addition reaction can be carried out without a solvent or after dilution with a solvent. The solvent is not particularly limited if does not affect the acid addition reaction. If a solvent has been used in the preceding epoxy carboxylation reaction, the solvent can also be directly subjected to the acid addition reaction without being removed provided that the solvent does not affect the acid addition reaction. Solvents that can be used may be the same as those that can be used in the carboxylation reaction.

The preferable amount of the solvent used should be adjusted as appropriate according to viscosity or use of the resulting resin. The solvent is preferably used so that the solid content is 90% to 30% by mass, more preferably 80% to 50% by mass.

In addition, the reaction can be carried out in a single or mixed organic solvent such as the reactive compound (D). In this case, if the reactive compound (D) is used as a curable resin composition, it can be used directly as a composition, which is thus preferable.

It is preferable to use a thermal polymerization inhibitor, and examples of the thermal polymerization inhibitor include the same thermal polymerization inhibitors as those used in the epoxy carboxylation reaction.

During this acid addition reaction, sampling is performed as appropriate, and a point when an acid value of a product of reaction falls within a range of plus or minus 10% of a set acid value is taken as an end point of the reaction. A preferable molecular weight range of the reactive polycarboxylic acid resin (II) thus obtained is as follows: a polystyrene equivalent weight average molecular weight in gel permeation chromatography (GPC) measurement is in a range of 500 to 50,000, more preferably 800 to 30,000, and particularly preferably 800 to 10,000. If the molecular weight is less than the above range, a cured product does not exhibit sufficient toughness; if the molecular weight is excessively more than the above range, the viscosity increases, and coating or development becomes difficult.

The content of the reactive polycarboxylic acid resin (II) in the present invention is preferably 90% by mass to 5% by mass with respect to all components. As the content of the reactive polycarboxylic acid resin (II) increases, while alkaline development time is shortened, dielectric properties and flexibility deteriorate. As the content of the reactive polycarboxylic acid resin (II) decreases, while dielectric properties and electrical insulation properties are improved, alkaline development time is delayed. Hence, the content of the reactive polycarboxylic acid resin (II) is more preferably in a range of 70% by mass to 30% by mass with respect to all components.

The reactive compound (D) other than the reactive polycarboxylic acid resin (II) of the present invention may be contained. Specific examples of the reactive compound (D) that may be used in the present invention include acrylates of a radical reaction type, other epoxy compounds of a cationic reaction type, and so-called reactive oligomers such as vinyl compounds sensitive to both radicals and cations.

Examples of the acrylates that may be used include monofunctional (meth)acrylates, polyfunctional (meth)acrylates, other epoxy acrylates, polyester acrylate, and urethane acrylate.

Examples of the monofunctional (meth)acrylates include methyl (meth)acrylate, ethyl (meth)acrylate, butyl (meth) acrylate, lauryl (meth)acrylate, polyethylene glycol (meth) acrylate, polyethylene glycol (meth)acrylate monomethyl ether, phenylethyl (meth)acrylate, isobornyl (meth)acrylate, cyclohexyl (meth)acrylate, benzyl (meth)acrylate, and tetrahydrofurfuryl (meth)acrylate.

Examples of the polyfunctional (meth)acrylates include butanediol di(meth)acrylate, hexanediol di(meth)acrylate, neopentyl glycol di(meth)acrylate, nonanediol di(meth) acrylate, ethylene glycol di(meth)acrylate, diethylene di(meth)acrylate, polyethylene glycol di(meth)acrylate, tris(meth) acryloyloxyethyl isocyanurate, polypropylene glycol di(meth)acrylate, adipate epoxy di(meth)acrylate, bisphenol ethylene oxide di(meth)acrylate, hydrogenated bisphenol ethylene oxide di(meth)acrylate, bisphenol di(meth)acrylate, di(meth)acrylate of ε-caprolactone adduct of neopentyl glycol hydroxypivalate, poly(meth)acrylate of a product of reaction between dipentaerythritol and ε-caprolactone, dipentaerythritol poly(meth)acrylate, trimethylolpropane tri (meth)acrylate, triethylolpropane tri(meth)acrylate and an ethylene oxide adduct thereof, pentaerythritol tri(meth)acrylate and an ethylene oxide adduct thereof, pentaerythritol tetra(meth)acrylate and an ethylene oxide adduct thereof, and dipentaerythritol hexa(meth)acrylate and an ethylene oxide adduct thereof.

Examples of the vinyl compounds that can be used include vinyl ethers, styrenes, and other vinyl compounds. Examples of the vinyl ethers include ethyl vinyl ether, propyl vinyl ether, hydroxyethyl vinyl ether, and ethylene glycol divinyl ether. Examples of the styrenes include styrene, methylstyrene, and ethylstyrene. Examples of the other vinyl compounds include triallyl isocyanurate and trimethallyl isocyanurate.

Furthermore, examples of the so-called reactive oligomers include urethane acrylate having an active energy ray-sensitive functional group and a urethane bond together in the same molecule, polyester acrylate similarly having an active energy ray-sensitive functional group and an ester bond together in the same molecule, epoxy acrylate derived from other epoxy resins and having active energy ray-sensitive functional groups together in the same molecule, and a reactive oligomer in which these bonds may be used in combination.

A cationic reactive monomer is generally not particularly limited if it is a compound having an epoxy group. Examples thereof include glycidyl (meth)acrylate, methyl glycidyl ether, ethyl glycidyl ether, butyl glycidyl ether, bisphenol A diglycidyl ether, 3,4-epoxycyclohexylmethyl-3,4-epoxycyclohexane carboxylate (such as "Cyracure UVR-6110" manufactured by Union Carbide), 3,4-epoxycyclohexylethyl-3,4-epoxycyclohexane carboxylate, vinylcyclohexene dioxide (such as "ELR-4206" manufactured by Union Carbide), limonene dioxide (such as "Celloxide 3000" manufactured by Daicel), allylcyclohexene dioxide, 3,4-epoxy-4-methylcyclohexyl-2-propylene oxide, 2-(3,4-epoxycyclohexyl-5,5-spiro-3,4-epoxy)cyclohexane-m-dioxane, bis(3,4-epoxycyclohexyl) adipate (such as "Cyracure UVR-6128" manufactured by Union Carbide), bis(3,4-epoxycyclohexylmethyl) adipate, bis(3,4-epoxycyclohexyl) ether, bis(3,4-epoxycyclohexylmethyl) ether, and bis(3,4-epoxycyclohexyl) diethylsiloxane.

Among them, radically curable acrylates are most preferable as the reactive compound (D). In the case of the cationic type, since the carboxylic acid may react with the epoxy group, a two-liquid mixture type may be used depending on the type of the reactive compound (D).

The content of the reactive compound (D) in the present invention is 0% by mass to 95% by mass, more preferably 3% by mass to 80% by mass, with respect to all components. Other components may include a photopolymerization initiator, other additives, a coloring material, a curing accelerator, and a volatile solvent added to adjust viscosity for the purpose of imparting coatability or the like. The other components that may be used are illustrated below as examples.

The resin composition of the present invention may further contain a coloring pigment, and the coloring pigment may be used in order to make the resin composition of the present invention a coloring material. It is inferred that particularly excellent affinity for pigments, that is, dispersibility, may be exhibited due to the hydroxyl group of the reactive polycarboxylic acid resin (II) used in the resin composition of the present invention. As a result of good dispersibility, a pigment concentration can be increased. In a composition that requires development, the dispersibility is further improved, good patterning properties are exhibited, and development residue in a development and dissolution portion is reduced, which is preferable.

That is, the reactive polycarboxylic acid resin (II) used in the resin composition of the present invention has high affinity with a coloring pigment such as carbon black, is able to exhibit good developability even at a high pigment concentration, and is able to be suitably used in color resist, a resist material for color filters, particularly a black matrix material, a black column spacer, or the like.

Examples of the coloring pigment include: an organic pigment, such as a phthalocyanine-based organic pigment, an azo-based organic pigment, and a quinacridone-based organic pigment; and an inorganic pigment, such as carbon black and titanium oxide. Among them, carbon black is preferable because of its high dispersibility.

The resin composition of the present invention may further contain a photopolymerization initiator. The photopolymerization initiator is preferably a radical photopolymerization initiator, a cationic photopolymerization initiator, or a photobase initiator.

Examples of the radical photopolymerization initiator include a well-known general radical photopolymerization initiator such as: benzoins, such as benzoin, benzoin methyl ether, benzoin ethyl ether, benzoin propyl ether, and benzoin isobutyl ether; acetophenones, such as acetophenone, 2,2-diethoxy-2-phenylacetophenone, 1,1-dichloroacetophenone, 2-hydroxy-2-methyl-phenylpropan-1-one, diethoxyacetophenone, 1-hydroxycyclohexylphenyl ketone, and 2-methyl-1-[4-(methylthio)phenyl]-2-morpholino-propan-1-one; anthraquinones, such as 2-ethylanthraquinone, 2-t-butylanthraquinone, 2-chloroanthraquinone, and 2-amylanthraquinone; thioxanthones, such as 2,4-diethylthioxanthone, 2-isopropylthioxanthone, and 2-chlorothioxanthone; ketals, such as acetophenone dimethyl ketal and benzyl dimethyl ketal; benzophenones, such as benzophenone, 4-benzoyl-4'-methyldiphenyl sulfide, and 4,4'-bismethylaminobenzophenone; and phosphine oxides, such as 2,4,6-trimethylbenzoyldiphenylphosphine oxide and bis(2,4,6-trimethylbenzoyl)-phenylphosphine oxide.

Examples of the cationic photopolymerization initiator include a diazonium salt of Lewis acid, an iodonium salt of Lewis acid, a sulfonium salt of Lewis acid, a phosphonium salt of Lewis acid, other halides, a triazine-based initiator, a borate-based initiator, and other photoacid generators.

Examples of the photobase initiator include TRD-001 (manufactured by Nippon Kayaku), TRD-008 (manufactured by Nippon Kayaku), WPBG-300 (manufactured by FUJIFILM Wako Pure Chemical), WPBG-345 (manufactured by FUJIFILM Wako Pure Chemical), PBG-266 (manufactured by FUJIFILM Wako Pure Chemical), WPBG-018 (manufactured by FUJIFILM Wako Pure Chemical), WPBG-027 (manufactured by FUJIFILM Wako Pure Chemical), WPBG-140 (manufactured by FUJIFILM Wako Pure Chemical), and WPBG-165 (manufactured by FUJIFILM Wako Pure Chemical).

Examples of the diazonium salt of Lewis acid include p-methoxyphenyl diazonium fluorophosphonate and N,N-diethylaminophenyl diazonium hexafluorophosphonate (such as SAN-AID SI-60L/SI-80L/SI-100L manufactured by Sanshin Chemical Industry). Examples of the iodonium salt of Lewis acid include diphenyliodonium hexafluorophosphonate and diphenyliodonium hexafluoroantimonate. Examples of the sulfonium salt of Lewis acid include triphenylsulfonium hexafluorophosphonate (such as Cyracure UVI-6990 manufactured by Union Carbide) and triphenylsulfonium hexafluoroantimonate (such as Cyracure UVI-6974 manufactured by Union Carbide). Examples of the phosphonium salt of Lewis acid include triphenylphosphonium hexafluoroantimonate.

Examples of the other halides include 2,2,2-trichloro-[1-4'-(dimethylethyl)phenyl]ethanone (such as Trigonal PI manufactured by AKZO), 2,2-dichloro-1-4-(phenoxyphenyl)ethanone (such as Sandray 1000 manufactured by Sandoz), and α,α,α-tribromomethyl phenyl sulfone (such as BMPS manufactured by Seitetsu Kagaku). Examples of the triazine-based initiator include 2,4,6-tris(trichloromethyl)-triazine, 2,4-trichloromethyl-(4'-methoxyphenyl)-6-triazine (such as Triazine A manufactured by Panchim), 2,4-trichloromethyl-(4'-methoxystyryl)-6-triazine (such as Triazine PMS manufactured by Panchim), 2,4-trichloromethyl-(piperonyl)-6-triazine (such as Triazine PP manufactured by Panchim), 2,4-trichloromethyl-(4'-methoxynaphthyl)-6-triazine (such as Triazine B manufactured by Panchim), 2 [2'(5-methylfuryl)ethylidene]-4,6-bis(trichloromethyl)-s-triazine (manufactured by Sanwa Chemical or the like), and 2(2'-furylethylidene)-4,6-bis(trichloromethyl)-s-triazine (manufactured by Sanwa Chemical).

Examples of the borate-based photopolymerization initiator include NK-3876 and NK-3881 manufactured by Japanese Research Institute for Photosensitizing Dyes. Examples of the other photoacid generators include 9-phenylacridine, 2,2'-bis(o-chlorophenyl)-4,4',5,5'-tetraphenyl-1,2-biimidazole (such as biimidazole manufactured by Kurogane Kasei), 2,2-azobis(2-amino-propane) dihydrochloride (such as V50 manufactured by FUJIFILM Wako Pure Chemical), 2,2-azobis[2-(imidazolin-2yl)propane]dihydrochloride (such as VA044 manufactured by FUJIFILM Wako Pure Chemical), [eta-5-2-4-(cyclopentadecyl)(1,2,3,4,5,6,eta)-(methylethyl)-benzene]iron(II) hexafluorophosphonate (such as Irgacure 261 manufactured by Ciba Geigy), and bis(y5-cyclopentadienyl)bis[2,6-difluoro-3-(1H-pyri-1-yl)phenyl]titanium (such as CGI-784 manufactured by Ciba Geigy).

In addition, an azo-based initiator such as azobisisobutyronitrile, a heat-sensitive peroxide-based radical initiator such as benzoyl peroxide, or the like may be used together. A radical photopolymerization initiator and a cationic photopolymerization initiator may both be used together. One kind of photopolymerization initiator may be used alone, or two or more kinds of photopolymerization initiators may be used together.

Among them, the radical type photopolymerization initiator is particularly preferable in view of the properties of the reactive polycarboxylic acid resin (II) of the present invention.

The resin composition of the present invention may further contain a coloring pigment. As the coloring pigment, for example, a so-called extender pigment, which is not intended for coloring, can also be used. Examples thereof include talc, barium sulfate, calcium carbonate, magnesium carbonate, barium titanate, aluminum hydroxide, silica, and clay.

The resin composition of the present invention may further contain other additives as necessary. As the other additives, for example, a thermosetting catalyst, such as melamine; a thixotropy-imparting agent, such as Aerosil; a silicone-based or fluorine-based leveling agent or antifoaming agent; a polymerization inhibitor, such as hydroquinone and hydroquinone monomethyl ether; a stabilizer; and an antioxidant, can be used.

In addition, as resins (so-called inert polymers) that exhibit no reactivity to an active energy ray, for example, other epoxy resins, phenol resins, urethane resins, polyester resins, ketone formaldehyde resins, cresol resins, xylene resins, diallyl phthalate resins, styrene resins, guanamine resins, natural and synthetic rubbers, acrylic resins, polyolefin resins, and modified products thereof, can also be used. These are preferably used in a range of up to 40 parts by mass in the resin composition.

In particular, if the reactive polycarboxylic acid resin (II) is to be used in solder resist applications, a well-known general epoxy resin is preferably used as the resins that exhibit no reactivity to an active energy ray. A reason is that, the carboxy group derived from the reactive polycarboxylic acid resin (II) may remain even after reaction and curing by an active energy ray, and as a result, a cured product thereof may deteriorate in water resistance or hydrolyzability. Accordingly, by using an epoxy resin, the remaining carboxyl group is further carboxylated, and a relatively strong crosslinked structure is formed. As the well-known general epoxy resin, the above cationic reactive monomer can be used.

For the purpose of adjusting viscosity depending on the purpose of use, a volatile solvent can also be added up to 50 parts by mass, more preferably up to 35 parts by mass, in the resin composition.

The resin composition of the present invention is easily cured by an active energy ray. Here, specific examples of the active energy ray include: electromagnetic waves, such as an ultraviolet ray, a visible ray, an infrared ray, an X-ray, a gamma ray, and a laser beam; and a particle beam, such as an alpha ray, a beta ray, and an electron beam. Among them, an ultraviolet ray, a laser beam, a visible ray, or an electron beam is preferable in view of suitable applications of the present invention.

A molding material in the present invention refers to a material for use in the following applications: putting an uncured composition into a mold or pressing the mold to mold an object, and then causing a curing reaction with an active energy ray for molding, or irradiating an uncured composition with focused light such as a laser, and causing a curing reaction for molding.

Specific applications include a planar molded sheet, a sealing material for protecting elements, and a so-called nanoimprint material in which a microfabricated "mold" is pressed against an uncured composition for performing fine molding. Furthermore, suitable applications include a light-emitting diode having particularly strict thermal requirements, and a peripheral sealing material of a photoelectric conversion element or the like.

The film forming material in the present invention is used for the purpose of coating a substrate surface. Specific applications include: an ink material, such as gravure ink, flexo ink, silk screen ink, and offset ink; a coating material, such as a hard coat, a top coat, an overprint varnish, and a clear coat; an adhesive material, such as various adhesives and sticking agents for lamination and optical discs or the like; and a resist material, such as solder resist, etching resist, and a resist for micromachines. Furthermore, a so-called dry film, in which the film forming material is temporarily coated onto a releasable substrate to form a film which is then pasted to an intended substrate to form a film, also corresponds to the film forming material.

The present invention also includes a cured product obtained by irradiating the curable resin composition with an active energy ray, and also includes a multilayer material having a layer of the cured product.

In the above, since adhesion to the substrate is increased by introduction of the carboxy group of the reactive polycarboxylic acid resin (II), preferable uses include for coating a plastic substrate or metal substrate.

Furthermore, by utilizing the characteristic that the reactive polycarboxylic acid resin (II) is soluble in an alkaline aqueous solution, preferable uses also include an alkaline water developable resist material composition.

A resist material composition in the present invention refers to an active energy ray-sensitive composition for forming a film layer of the composition on a substrate, followed by partial irradiation with an active energy ray such as an ultraviolet ray, and attempting to perform drawing by utilizing a difference in physical properties between an irradiated portion and an unirradiated portion. Specifically, the resist material composition is a composition used for the purpose of removing the irradiated portion or the unirradiated portion by some method, for example, by dissolving the same with a solvent or the like or an alkaline solution, and performing drawing.

The resin composition of the present invention, which is a resist material composition, can be adapted to various materials that can be patterned. For example, the resin composition is particularly useful in a solder resist material and an interlayer insulating material for a build-up method. Furthermore, the resin composition may also be used as an optical waveguide in an electrical/electronic/optical substrate such as a printed wiring board, an optoelectronic substrate or an optical substrate.

Particularly suitable applications include a wide range of applications such as a photosensitive film, a photosensitive film with a support, an insulating resin sheet such as prepreg, a circuit board (such as for laminated boards and multilayer printed wiring boards), solder resist, an underfill material, a die bonding material, a semiconductor encapsulating material, a hole-filling resin, and a part-embedding resin, in which good heat resistance or developability can be utilized and a resin composition is required. In the above, since good developability can be exhibited even at a high pigment concentration, the resin composition can be suitably used in color resist, a resist material for color filters, particularly a black matrix material.

Furthermore, the resin composition can also be suitably used in a resin composition for an insulating layer of a multilayer printed wiring board (a multilayer printed wiring board having a cured product of a photosensitive resin composition as an insulating layer), a resin composition for an interlayer insulating layer (a multilayer printed wiring board having a cured product of a photosensitive resin composition as an interlayer insulating layer), and a resin composition for plating (a multilayer printed wiring board in which a plating is formed on a cured product of a photosensitive resin composition).

Patterning using the resin composition of the present invention can be performed, for example, as follows. The curable resin composition of the present invention is coated to a film thickness of 0.1 to 200 μm on a substrate by a method such as screen printing, spraying, roll coating, electrostatic coating, curtain coating, and spin coating. By drying the coating film at a temperature of generally 50° C. to 110° C., preferably 60° C. to 100° C., a coating film can be formed. After that, the coating film is directly or indirectly irradiated with a high-energy ray such as an ultraviolet ray at an intensity of generally about 10 to 2000 $mJ/cm^2$ through a photomask having an exposure pattern formed thereon, and a desired pattern can be obtained by, for example, spraying, vibrating dipping, puddle, or brushing, using a developer described later.

As the alkaline aqueous solution used in the above development, an aqueous solution of inorganic alkaline such as potassium hydroxide, sodium hydroxide, sodium carbonate, potassium carbonate, sodium hydrogencarbonate, potassium hydrogencarbonate, sodium phosphate, and potassium phosphate, or an aqueous solution of organic alkaline such as tetramethylammonium hydroxide, tetraethylammonium hydroxide, tetrabutylammonium hydroxide, monoethanolamine, diethanolamine, and triethanolamine, can be used. This aqueous solution may further contain an organic solvent, a buffer, a complexing agent, a dye or a pigment.

In addition, the present invention is particularly suitably used in dry film applications in which mechanical strength before a curing reaction by an active energy ray is required. That is, a balance between hydroxyl groups and carboxyl groups of the reactive polycarboxylic acid resin (II) used in the present invention is within a specific range, and thus, the reactive polycarboxylic acid resin (II) of the present invention is able to exhibit good developability.

A method for forming a film is not particularly limited, and an intaglio printing method such as gravure, a letterpress printing method such as flexo, a stencil printing method such as silk screen, a lithographic printing method such as offset, and various coating methods such as a roll coater, a knife coater, a die coater, a curtain coater and a spin coater, can be arbitrarily adopted.

EXAMPLES

Hereinafter, the present invention will be described in further detail according to examples. However, the present invention is not limited by these examples. In the examples, % indicates % by mass unless otherwise specified.

The softening point, epoxy equivalent and acid value were measured under the following conditions.

1) Epoxy equivalent: measured by a method in accordance with JISK7236:2001.
2) Acid value: measured by a method in accordance with JISK0070:1992.
3) Measurement conditions of GPC were as follows.
   model: TOSOH HLC-8320GPC
   column: Super HZM-N eluent: THF (tetrahydrofuran); 0.35 ml/min, 40° C.
detector: RI (differential refractometer)
molecular weight standard: polystyrene <Maleimide Resin (I)>

Synthesis Example 1 (I-1)

110 g of toluene and 36 g of N-methylpyrrolidone were put into a 500 ml round bottom flask equipped with a fluororesin-coated stirring bar. Next, 85.6 g (0.16 mol) of PRIAMINE 1074 (manufactured by Croda Japan) as the dimer acid-derived diamine (a-1) was added, 15.4 g (0.16 mol) of methanesulfonic anhydride was then slowly added, and a salt was formed. Stirring and mixing were performed for about 10 minutes, and 1,2,4,5-cyclohexanetetracarboxylic dianhydride (24.5 g, 0.08 mol) as the polybasic acid anhydride (a-2) was then slowly added to the stirred mixture. A Dean-Stark trap and a condenser were attached to the flask. The mixture was heated under reflux for 6 hours to form an amine-terminated diimide. A theoretical amount of water produced from this condensation was obtained by this time. The reaction mixture was cooled at room temperature or lower, and 18.8 g (0.19 mol) of maleic anhydride was added to the flask. The mixture was refluxed for additional 8 hours to obtain an expected amount of water produced. After cooling to room temperature, 200 ml of toluene was further added to the flask. Next, a diluted organic layer was washed with water (100 ml×3), and the salt and unreacted starting materials were removed. After that, a solvent was removed under vacuum, and 108 g (yield=90%, Mw=3,600) of an amber-colored, wax-like maleimide compound was obtained.

Synthesis Example 2 (I-2)

110 g of toluene and 36 g of N-methylpyrrolidone were put into a 500 ml round bottom flask equipped with a fluororesin-coated stirring bar. Next, 85.3 g (0.16 mol) of PRIAMINE 1074 (manufactured by Croda Japan) as the dimer acid-derived diamine (a-1) was added, 15.4 g (0.16 mol) of methanesulfonic anhydride was then slowly added, and a salt was formed. Stirring and mixing were performed for about 10 minutes, and 4,4'-oxydiphthalic dianhydride (24.8 g, 0.08 mol) as the polybasic acid anhydride (a-2) was slowly added to the stirred mixture. A Dean-Stark trap and a condenser were attached to the flask. The mixture was heated under reflux for 6 hours to form an amine-terminated diimide. A theoretical amount of water produced from this condensation was obtained by this time. The reaction mixture was cooled at room temperature or lower, and 18.8 g (0.19 mol) of maleic anhydride was added to the flask. The mixture was refluxed for additional 8 hours to obtain an expected amount of water produced. After cooling to room temperature, 200 ml of toluene was further added to the flask. Next, a diluted organic layer was washed with water (100 ml×3), and the salt and unreacted starting materials were removed. After that, a solvent was removed under vacuum, and 106 g (yield=88%, Mw=3,700) of a brown-colored, wax-like maleimide compound was obtained.

Synthesis Example 3 (I-3)

110 g of toluene and 36 g of N-methylpyrrolidone were put into a 500 ml round bottom flask equipped with a fluororesin-coated stirring bar. Next, 460.8 g (0.85 mol) of PRIAMINE 1074 (manufactured by Croda Japan) as the dimer acid-derived diamine (a-1) was added, 81.7 g (0.85 mol) of methanesulfonic anhydride as a catalyst was then slowly added, and a salt was formed. Stirring and mixing were performed for about 10 minutes, and 200.0 g (2.04 mol) of maleic anhydride was added to the flask. The mixture was refluxed for additional 8 hours to obtain an expected amount of water produced. After cooling to room temperature, 200 ml of toluene was further added to the flask. Next, a diluted organic layer was washed with water (100 ml×3), and the salt and unreacted starting materials were removed. After that, a solvent was removed under vacuum, and 520.0 g (yield=89%, Mw=689) of a brown-colored, wax-like maleimide compound was obtained.

Synthesis Example A (I-4)

110 g of toluene and 36 g of N-methylpyrrolidone were put into a 500 ml round bottom flask equipped with a Teflon (registered trademark)-coated stirring bar. Next, 73.5 g (0.14 mol) of PRIAMINE 1074 (manufactured by Croda Japan) and 8.4 g (0.06 mol) of 1,3-bis(aminomethyl)cyclohexane were added, 18.9 g (0.20 mol) of methanesulfonic anhydride was then slowly added, and a salt was formed. Stirring and mixing were performed for about 10 minutes, and 5-(2,5-dioxotetrahydrofuryl)-3-methyl-3-cyclohexene-1,2-dicarboxylic dianhydride (26.0 g, 0.10 mol) was then slowly added to the stirred mixture. A Dean-Stark trap and a condenser were attached to the flask. The mixture was heated under reflux for 6 hours to form an amine-terminated diimide. A theoretical amount of water produced from this condensation was obtained by this time. The reaction mixture was cooled at room temperature or lower, and 23.1 g (0.24 mol) of maleic anhydride was added to the flask. The mixture was refluxed for additional 8 hours to obtain an expected amount of water produced. After cooling to room temperature, 200 ml of toluene was further added to the flask. Next, a diluted organic layer was washed with water (100 ml×3), and the salt and unreacted starting materials were removed. After that, a solvent was removed under vacuum, and 108 g (yield=90%, Mw=2,800) of an amber-colored, wax-like maleimide compound was obtained.

<Reactive Polycarboxylic Acid Resin (II)>

Synthesis Example 4 (II-1)

In a 1 L four-necked flask, 330 g of XD-1000 (manufactured by Nippon Kayaku, having a softening point of 70° C. and an epoxy equivalent of 252 g/eq.) as the epoxy resin (b-1), 95 g of acrylic acid (AA) as the compound (b-2) having a polymerizable ethylenically unsaturated group and a carboxy group together in one molecule, 3 g of BHT (dibutylhydroxytoluene) as a polymerization inhibitor, 3 g of triphenylphosphine as a catalyst, and propylene glycol monomethyl ether monoacetate as a solvent were added to achieve a solid content of 80% by mass. A reaction was carried out at 100° C. for 24 hours, and the reaction was terminated when a solid content acid value (AV: mgKOH/g) became 3 or less, and a reactive epoxycarboxylate resin solution was obtained. The solid content acid value (mgKOH/g) was measured as a solution and converted to a value in terms of solid content.

Subsequently, to the obtained reactive epoxy carboxylate resin solution, 180 g of THPA (1,2,3,6-tetrahydrophthalic anhydride, manufactured by New Japan Chemical) as the polybasic acid anhydride (b-3), and propylene glycol monomethyl ether monoacetate as a solvent were added to achieve a solid content of 65%. The mixture was heated to 100° C., followed by being subjected to an acid addition reaction to obtain a solution of a reactive polycarboxylic acid resin (II-1). The obtained reactive polycarboxylic acid resin (II-1) had a solid content acid value (AV: mgKOH/g) of 110.

Synthesis Example 5 (II-2)

In a 1 L four-necked flask, 315 g of NC-6000 (manufactured by Nippon Kayaku, having a softening point of 60° C. and an epoxy equivalent of 207 g/eq.) as the epoxy resin (b-1), 110 g of acrylic acid (AA) as the compound (b-2) having a polymerizable ethylenically unsaturated group and a carboxy group together in one molecule, 3 g of BHT (dibutylhydroxytoluene) as a polymerization inhibitor, 3 g of triphenylphosphine as a catalyst, and propylene glycol monomethyl ether monoacetate as a solvent were added to achieve a solid content of 80% by mass. A reaction was carried out at 100° C. for 24 hours, and the reaction was terminated when a solid content acid value (AV: mgKOH/g) became 3 or less, and a reactive epoxycarboxylate resin solution was obtained. The solid content acid value (mgKOH/g) was measured as a solution and converted to a value in terms of solid content.

Subsequently, to the obtained reactive epoxy carboxylate resin solution, 158 g of THPA (1,2,3,6-tetrahydrophthalic anhydride, manufactured by New Japan Chemical) as the polybasic acid anhydride (b-3), and propylene glycol monomethyl ether monoacetate as a solvent were added to achieve a solid content of 65%. The mixture was heated to 100° C., followed by being subjected to an acid addition reaction to obtain a solution of a reactive polycarboxylic acid resin (II-2). The obtained reactive polycarboxylic acid resin (II-2) had a solid content acid value (AV: mgKOH/g) of 100.

Synthesis Example 6 (II-3)

In a 1 L four-necked flask, 312 g of NC-3500 (manufactured by Nippon Kayaku, having a softening point of 70° C. and an epoxy equivalent of 205 g/eq.) as the epoxy resin (b-1), 111 g of acrylic acid (AA) as the compound (b-2) having a polymerizable ethylenically unsaturated group and a carboxy group together in one molecule, 3 g of BHT (dibutylhydroxytoluene) as a polymerization inhibitor, 3 g of triphenylphosphine as a catalyst, and propylene glycol monomethyl ether monoacetate as a solvent were added to achieve a solid content of 80% by mass. A reaction was carried out at 100° C. for 24 hours, and the reaction was terminated when a solid content acid value (AV: mgKOH/g) became 3 or less, and a reactive epoxycarboxylate resin solution was obtained. The solid content acid value (mgKOH/g) was measured as a solution and converted to a value in terms of solid content.

Subsequently, to the obtained reactive epoxy carboxylate resin solution, 157 g of THPA (1,2,3,6-tetrahydrophthalic anhydride, manufactured by New Japan Chemical) as the polybasic acid anhydride (b-3), and propylene glycol monomethyl ether monoacetate as a solvent were added to achieve a solid content of 65%. The mixture was heated to 100° C., followed by being subjected to an acid addition reaction to obtain a solution of a reactive polycarboxylic acid resin (II-3). The obtained reactive polycarboxylic acid resin (II-3) had a solid content acid value (AV: mgKOH/g) of 100.

Synthesis Example 7 (II-4)

In a 1 L four-necked flask, 305 g of EPPN-503 (manufactured by Nippon Kayaku, having a softening point of 94° C. and an epoxy equivalent of 185 g/eq.) as the epoxy resin (b-1), 120 g of acrylic acid (AA) as the compound (b-2) having a polymerizable ethylenically unsaturated group and a carboxy group together in one molecule, 3 g of BHT (dibutylhydroxytoluene) as a polymerization inhibitor, 3 g of triphenylphosphine as a catalyst, and propylene glycol monomethyl ether monoacetate as a solvent were added to achieve a solid content of 80% by mass. A reaction was carried out at 100° C. for 24 hours, and the reaction was terminated when a solid content acid value (AV: mgKOH/g) became 3 or less, and a reactive epoxycarboxylate resin solution was obtained. The solid content acid value (mgKOH/g) was measured as a solution and converted to a value in terms of solid content.

Subsequently, to the obtained reactive epoxy carboxylate resin solution, 158 g of THPA (1,2,3,6-tetrahydrophthalic anhydride, manufactured by New Japan Chemical) as the polybasic acid anhydride (b-3), and propylene glycol monomethyl ether monoacetate as a solvent were added to achieve a solid content of 65%. The mixture was heated to 100° C., followed by being subjected to an acid addition reaction to obtain a solution of a reactive polycarboxylic acid resin (II-4). The obtained reactive polycarboxylic acid resin (II-4) had a solid content acid value (AV: mgKOH/g) of 100.

Synthesis Example 8 (II-5)

In a 1 L four-necked flask, 336 g of NC-3000 (manufactured by Nippon Kayaku, having a softening point of 58° C. and an epoxy equivalent of 276 g/eq.) as the epoxy resin (b-1), 89 g of acrylic acid (AA) as the compound (b-2) having a polymerizable ethylenically unsaturated group and a carboxy group together in one molecule, 3 g of BHT (dibutylhydroxytoluene) as a polymerization inhibitor, 3 g of triphenylphosphine as a catalyst, and propylene glycol monomethyl ether monoacetate as a solvent were added to achieve a solid content of 80% by mass. A reaction was carried out at 100° C. for 24 hours, and the reaction was terminated when a solid content acid value (AV: mgKOH/g) became 3 or less, and a reactive epoxycarboxylate resin solution was obtained. The solid content acid value (mgKOH/g) was measured as a solution and converted to a value in terms of solid content.

Subsequently, to the obtained reactive epoxy carboxylate resin solution, 158 g of THPA (1,2,3,6-tetrahydrophthalic anhydride, manufactured by New Japan Chemical) as the polybasic acid anhydride (b-3), and propylene glycol monomethyl ether monoacetate as a solvent were added to achieve a solid content of 65%. The mixture was heated to 100° C., followed by being subjected to an acid addition reaction to obtain a solution of a reactive polycarboxylic acid resin (II-5). The obtained reactive polycarboxylic acid resin (II-5) had a solid content acid value (AV: mgKOH/g) of 100.

<Photoinitiator>

Irgacure 907 (manufactured by BASF)

<Photosensitizer>

Kayacure DETX-S (manufactured by Nippon Kayaku)

<Solvent>

Carbitol acetate (CA)

Examples 1 to 11 and Comparative Examples 1 to 8

The components (I) to (II) as well as the photoinitiator, the photosensitizer and the solvent were blended in the amounts shown in Tables 1 and 2, and photosensitive resin compositions of Examples 1 to 11 and Comparative Examples 1 to 8 were prepared.

<Evaluation of Photosensitive Resin Composition>

The photosensitive resin compositions of Examples 1 to 11 and Comparative Examples 1 to 8 were evaluated as follows. The results are summarized in Tables 1 and 2.

TABLE 1

| Component | Material | Example 1 | Example 2 | Example 3 | Example 4 | Example 5 | Example 6 | Example 7 | Example 8 | Example 9 | Example 10 | Example 11 |
|---|---|---|---|---|---|---|---|---|---|---|---|---|
| Maleimide compound (I) | (I-1) | 67 | | | 60 | 60 | 60 | 60 | | | | |
| | (I-2) | | 50 | | | | | | | | | |
| | (I-3) | | | 33 | | | | | 50 | 40 | 40 | |
| | (I-4) | | | | | | | | | | | 60 |
| Reactive polycarboxylic acid resin (II) | (II-1) | 33 | 50 | 67 | 34 | 34 | 34 | 34 | 50 | | | 34 |
| | (II-2) | | | | 6 | | | | | 60 | | 6 |
| | (II-3) | | | | | 6 | | | | | 60 | |
| | (II-4) | | | | | | 6 | | | | | |
| | (II-5) | | | | | | | 6 | | | | |
| Photoinitiator | Irg.907 | 0.5 | 0.5 | 0.5 | 0.5 | 0.5 | 0.5 | 0.5 | 0.5 | 0.5 | 0.5 | 0.5 |
| Sensitizer | DETX-S | 0.02 | 0.02 | 0.02 | 0.02 | 0.02 | 0.02 | 0.02 | 0.02 | 0.02 | 0.02 | 0.02 |
| Solvent | CA | 30 | 30 | 30 | 30 | 30 | 30 | 30 | 30 | 30 | 30 | 30 |
| Compatibility | | ○ | ○ | ○ | ○ | ○ | ○ | ○ | ○ | ○ | ○ | ○ |
| Developability | | ◎ | ◎ | ◎ | ◎ | ◎ | ◎ | ◎ | ○ | ○ | ○ | ○ |
| Dielectric properties | Dielectric constant | 2.6 | 2.7 | 2.8 | 2.8 | 2.8 | 2.8 | 2.8 | 2.7 | 2.8 | 2.8 | 2.8 |
| | Dielectric tangent | 0.005 | 0.010 | 0.012 | 0.009 | 0.009 | 0.009 | 0.010 | 0.010 | 0.015 | 0.016 | 0.012 |
| Mechanical properties | Tensile elastic modulus (GPa) | 1.05 | 1.32 | 1.55 | 1.08 | 1.10 | 1.10 | 1.12 | 1.14 | 1.30 | 1.34 | 1.544 |
| | Elongation at break (%) | 60 | 50 | 41 | 54 | 56 | 50 | 48 | 49 | 42 | 41 | 40 |
| Insulation reliability | HAST resistance | ○ | ○ | ○ | ○ | ○ | ○ | ○ | ○ | ○ | ○ | ○ |

TABLE 2

| Component | Material | Comparative Example 1 | Comparative Example 2 | Comparative Example 3 | Comparative Example 4 | Comparative Example 5 | Comparative Example 6 | Comparative Example 7 | Comparative Example 8 |
|---|---|---|---|---|---|---|---|---|---|
| Maleimide compound (I) | (I-1) | 100 | | | | | | | |
| | (I-2) | | 100 | | | | | | |
| | (I-3) | | | 100 | | | | | |
| Reactive polycarboxylic acid resin (II) | (II-1) | | | | 100 | | | | |
| | (II-2) | | | | | 100 | | | |
| | (II-3) | | | | | | 100 | | |
| | (II-4) | | | | | | | 100 | |
| | (II-5) | | | | | | | | 100 |
| Photoinitiator | Irg.907 | 0.5 | 0.5 | 0.5 | 0.5 | 0.5 | 0.5 | 0.5 | 0.5 |
| Sensitizer | DETX-S | 0.02 | 0.02 | 0.02 | 0.02 | 0.02 | 0.02 | 0.02 | 0.02 |
| Solvent | CA | 30 | 30 | 30 | 30 | 30 | 30 | 30 | 30 |
| Compatibility | | ○ | ○ | ○ | ○ | ○ | ○ | ○ | ○ |
| Developability | | X | X | X | ○ | ○ | ○ | ○ | ○ |
| Dielectric properties | Dielectric constant | 2.4 | 2.4 | 2.4 | 3.2 | 3.3 | 3.4 | 3.3 | 3.3 |
| | Dielectric tangent | 0.003 | 0.003 | 0.003 | 0.025 | 0.027 | 0.028 | 0.030 | 0.031 |

TABLE 2-continued

| Component | Material | Comparative Example 1 | Comparative Example 2 | Comparative Example 3 | Comparative Example 4 | Comparative Example 5 | Comparative Example 6 | Comparative Example 7 | Comparative Example 8 |
|---|---|---|---|---|---|---|---|---|---|
| Mechanical properties | Tensile elastic modulus (GPa) | 0.20 | 0.21 | 0.15 | 2.3 | 2.4 | 2.3 | 2.4 | 2.4 |
| | Elongation at break (%) | 81 | 80 | 79 | 3 | 3 | 4 | 3 | 3 |
| Insulation reliability | HAST resistance | ○ | ○ | ○ | Δ | Δ | Δ | Δ | Δ |

(Compatibility)

It was visually confirmed whether the photosensitive resin compositions obtained in Examples 1 to 11 and Comparative Examples 1 to 8 were uniformly mixed.

○: compatibly mixed

Δ: slight turbidity was observed x: not compatible at all and a white turbid precipitate was observed (Developability)

The photosensitive resin compositions obtained in Examples 1 to 11 and Comparative Examples 1 to 8 were cast on a copper clad laminate (ELC4762 manufactured by Sumitomo Bakelite), heated at 80° C. for 30 minutes to form a coating film having a thickness of 20 μm to 25 μm. Next, an ultraviolet ray of 500 mJ/cm$^2$ was irradiated through a step tablet (STOUFFER 21 STEP SENSITIVITY GUIDE manufactured by Kodak). After that, spray development (spray pressure: 0.2 MPa) was carried out with a 10% sodium carbonate aqueous solution, and resin at a portion not irradiated with the ultraviolet ray was removed. Developability was evaluated by the time (so-called break time) required for a pattern-shaped portion to be completely developed during development of an exposed portion transmitted through a pattern mask.

◎: break time is within 30 to 60 seconds

○: break time is within 61 to 120 seconds x: undevelopable (Evaluation of Dielectric Properties (Dielectric Constant and Dielectric Tangent))

For evaluation of dielectric properties, varnish was coated and dried on a copper foil with a desk coater to have a thickness after drying of 50 μm, and a resin film (semi-cured) was obtained. Next, the obtained resin film (semi-cured) was irradiated with UV of 1000 mJ/cm$^2$. Furthermore, the copper foil as a support was removed by physical peeling or etching, and a resin film for evaluation was obtained.

Then, a laminate obtained by laminating the resin films to achieve a length of 60 mm, a width of 2 mm, and a thickness of 50 μm was used as a test piece, and was measured for dielectric properties by a cavity resonator perturbation method. A vector type network analyzer ADMSO10c1 manufactured by AET was used as a measurement instrument, and CP531 (10 GHz band resonator) manufactured by Kanto Electronics Application & Development was used as a cavity resonator. The conditions included a frequency of 10 GHz and a measurement temperature of 25° C.

(Evaluation of Mechanical Properties)

First, on a copper foil having a thickness of 12 μm, the photosensitive resin composition obtained in each example and comparative example was coated to a thickness of about 20 μm using an applicator, dried at a temperature of 80° C. for 30 minutes to form a film-like photosensitive resin composition on the copper foil. The coating thickness of the photosensitive resin composition was adjusted so that the film-like photosensitive resin composition after drying had a film thickness of 20 μm to 25 μm. The film-like photosensitive resin composition was subjected to exposure at a wavelength of 365 nm and an exposure amount of 1000 mJ/cm$^2$ using a "super-high pressure mercury lamp 500 W multilight" manufactured by USHIO. Next, by removing the copper foil by etching, a cured film was obtained.

Next, the obtained cured film was cut into a length of 50 mm and a width of 5 mm, and was measured for tensile elastic modulus (GPa) and elongation at break (%) using Tensilon (tensile tester) at a chuck distance of 4 cm and a temperature of 23° C. under the condition of a tensile speed of 5 mm/min.

(HAST Resistance)

Each composition was coated to a thickness of 25 μm on Espanex M series (manufactured by Nippon Steel Chemical: base imide thickness: 25 μm, Cu thickness: 18 μm) having a comb pattern of L/S=100 μm/100 μm formed thereon, and the coating film was dried with a hot air dryer at 80° C. for 30 minutes. Next, by exposing the coating film at 1000 mJ/cm$^2$ and curing the same using an ultraviolet exposure device (manufactured by USHIO: 500 W multilight), a test substrate for HAST evaluation was obtained. An electrode portion of the obtained substrate was connected to a wire by soldering, placed in an environment of 130° C./85% RH, and applied with a voltage of 5.5 V. The time until a resistance value became $1\times10^9$ Ω or less was measured.

○: more than 300 hours

Δ: 30 to 300 hours

X: less than 30 hours

As is clear from the results shown in Tables 1 and 2, the photosensitive resin composition of the present invention can be developed with a weakly alkaline aqueous solution, and a cured product thereof exhibits high flexibility, high dielectric properties and high insulation reliability.

The invention claimed is:

1. A resin composition, comprising: a maleimide compound (I), being a product of reaction between a dimer acid-derived diamine (a-1) and maleic anhydride; and a reactive polycarboxylic acid resin (II), being a product of reaction between a reactive epoxycarboxylate resin and a polybasic acid anhydride (b-3), wherein the reactive epoxycarboxylate resin is a product of reaction between an epoxy resin (b-1) and a compound (b-2) having a polymerizable ethylenically unsaturated group and a carboxy group together in one molecule.

2. The resin composition according to claim 1, wherein the maleimide compound (I) comprises the dimer acid-derived diamine (a-1), a polybasic acid anhydride (a-2), and the maleic anhydride.

3. The resin composition according to claim 2, wherein the polybasic acid anhydride (a-2) has an alicyclic structure.

4. The resin composition according to claim 1, wherein the maleimide compound (I) is expressed by general formula (1):

(1)

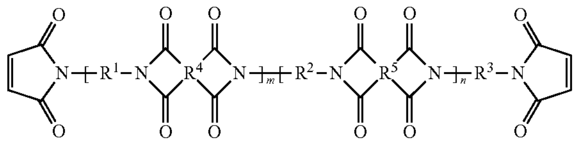

wherein, in formula (1), $R^1$ represents a dimer acid-derived divalent hydrocarbon group (a), $R^2$ represents a divalent organic group (b) other than the dimer acid-derived divalent hydrocarbon group (a), $R^3$ represents any one selected from a group consisting of the dimer acid-derived divalent hydrocarbon group (a) and the divalent organic group (b) other than the dimer acid-derived divalent hydrocarbon group (a), $R^4$ and $R^5$ each independently contain, with respect to a total amount of $R^4$ and $R^5$ of 100 mol %, 5 mol % to 95 mol % of one or more organic groups selected from a C6 to C40 tetravalent organic group having a monocyclic or condensed polycyclic alicyclic structure, a C4 to C40 tetravalent organic group in which organic groups having a monocyclic alicyclic structure are connected to each other directly or via a crosslinked structure, and a C4 to C40 tetravalent organic group having a semi-alicyclic structure including both an alicyclic structure and an aromatic ring, m is an integer of 1 to 30, n is an integer of 0 to 30, a plurality of $R^1$ and a plurality of $R^4$ may each be the same or different in response to m being 2 or more, and a plurality of $R^2$ and a plurality of $R^5$ may each be the same or different in response to n being 2 or more.

5. The resin composition according to claim 1, wherein the epoxy resin (b-1) is expressed by general formula (2):

(2)

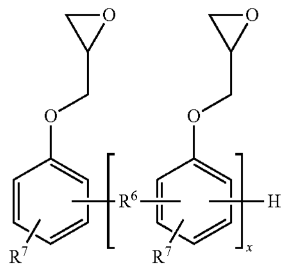

wherein, in formula (2), $R^6$ represents a hydrocarbon group containing an aromatic ring or a C1 to C40 alicyclic skeleton, $R^7$ may each be the same or different and represents a hydrogen atom, a halogen atom or a C1 to C40 hydrocarbon group, and x is an integer of 1 to 30.

6. The resin composition according to claim 1, comprising a photopolymerization initiator.

7. A cured product of the resin composition according to claim 1.

8. A multilayer material comprising a layer of the cured product according to claim 7.

* * * * *